(12) United States Patent
Mugler et al.

(10) Patent No.: US 11,821,971 B2
(45) Date of Patent: Nov. 21, 2023

(54) METHODS, SYSTEMS, AND COMPUTER READABLE MEDIA FOR UTILIZING SPECTRAL CIRCLES FOR MAGNETIC RESONANCE SPECTROSCOPY ANALYSIS

(71) Applicant: MUSC Foundation for Research Development, Charleston, SC (US)

(72) Inventors: Dale H. Mugler, Highland Park, IL (US); William S. Clary, Copley, OH (US)

(73) Assignee: MUSC Foundation for Research Development, Charleston, SC (US)

( * ) Notice: Subject to any disclaimer, the term of this patent is extended or adjusted under 35 U.S.C. 154(b) by 0 days.

(21) Appl. No.: 17/765,315

(22) PCT Filed: Sep. 7, 2021

(86) PCT No.: PCT/US2021/049288
§ 371 (c)(1),
(2) Date: Mar. 30, 2022

(87) PCT Pub. No.: WO2022/051717
PCT Pub. Date: Mar. 10, 2022

(65) Prior Publication Data
US 2023/0194637 A1   Jun. 22, 2023

Related U.S. Application Data

(60) Provisional application No. 63/074,867, filed on Sep. 4, 2020.

(51) Int. Cl.
*G01R 33/46* (2006.01)
*G01R 33/485* (2006.01)

(52) U.S. Cl.
CPC ....... *G01R 33/4625* (2013.01); *G01R 33/485* (2013.01)

(58) Field of Classification Search
CPC .................. G01R 33/4625; G01R 33/485
See application file for complete search history.

(56) References Cited

U.S. PATENT DOCUMENTS

| 4,876,507 A | * | 10/1989 | Van Vaals | .......... | G01R 33/4625 |
| | | | | | 324/309 |
| 2011/0066025 A1 | | 3/2011 | Bahn | | |
| 2015/0362571 A1 | | 12/2015 | Le Fur | | |

FOREIGN PATENT DOCUMENTS

| WO | WO 2017/125800 A1 | 7/2017 |
| WO | WO 2020/051716 A1 | 3/2020 |

OTHER PUBLICATIONS

Clary et al., "Shifted Fourier Matrices and Their Tridiagonal Commutors." SIAM J. on Matrix Analysis and Applications, vol. 24(3), pp. 809-821 (2003).

(Continued)

*Primary Examiner* — Steven L Yeninas
(74) *Attorney, Agent, or Firm* — Jenkins, Taylor & Hunt, P.A.

(57) ABSTRACT

A method comprising collecting magnetic resonance imaging (MRI) scanner data corresponding to a region of interest, establishing a spectral peak profile associated with at least one metabolite in the region of interest, wherein the spectral peak profile comprises a term in the FID vector signal included in the collected MRI scanner data, selecting at least three counter indices and corresponding points on the spectral peak profile to compute a linear fractional transformation (LFT), computing an N-dimensional vector outlining a spectral circle in a complex plane by applying the LFT to each counter index included in a set of equally-spaced counter indices associated with a three-dimensional spectrum representation of the collected MRI scanner data, shifting the spectral circle to eliminate a baseline offset for a magnitude spectrum associated with the complex plane, (Continued)

rotating the shifted spectral circle to produce a rotated spectral circle.

20 Claims, 17 Drawing Sheets

(56) References Cited

OTHER PUBLICATIONS

Mugler et al., "Eigenvectors for a Class of Discrete Cosine and Sine Transforms." Sampling Theory in Signal and Image Processing, vol. 3, pp. 83-94 (2004).
Mugler, "The centered discrete fourier transform and a parallel implementation of the FFT." In 2011 International Conference on Acoustics, Speech, and Signal Processing (ICASSP) (2011).
Mugler et al., "Discrete Hermite Functions." In Proceedings of the International Conference on Scientific Computing and Mathematical Modeling, IMACS 2000. Milwaukee, pp. 318-321 (2000).
Mugler et al., "Frequency Determination Using the Discrete Hermite Transform." In New Perspectives on Approximation and Sampling Theory, Applied and Numerical Harmonic Analysis Series, eds. A. Zayed and G. Schmeisser, pp. 383-398 (2014).
Mugler et al., "Discrete Hermite Functions and the Fractional Fourier Transform." In Proceedings of the International Workshop on Sampling Theory, SampTA'01. Orlando, pp. 1-6 (2001).
Wishart et al., "HMDB 5.0: the Human Metabolome Database for 2022." Nucleic Acids Res, vol. 50, D622-D631 (published online Nov. 2021).
Aetna Insurance. Magnetic Resonance Spectroscopy (MRS): Medical Clinical Policy Bulletins. http://www.aetna.com/cpb/medical/data/200-299/0202.html, (Apr. 15, 2015).
Horska et al., "Imaging of brain tumors: MR spectroscopy and metabolic imaging." Neuroimaging Clin. N. Am., vol. 20(3), pp. 293-310 (2010).
Llufriu et al., "Magnetic Resonance Spectroscopy markers of Disease Progression in Multiple Sclerosis." JAMA Neurol., vol. 71(7), pp. 840-847 (2014).
Bredella et al., "Ectopic and Serum Lipid Levels Are Positively Associated with Bone Marrow Fat in Obesity." Radiology, vol. 269(2), pp. 534-541 (2013).
Forrest, "MR spectroscopy offers insight into neonates' brain damage." auntminnie.com (2018).
Hyperfine, Swoop Portable MR Imaging System, https://hyperfine.io/, accessed Mar. 24, 2022.
Bohnert et al., "Current Clinical Applications of MR Spectroscopy of the Brain." Barrow Quarterly, vol. 16(2), pp. 44-61 (2000).
Govindaraju et al., "Proton NMR chemical shifts and coupling constants for brain metabolites." NMR Biomed., vol. 13, pp. 129-153 (2000).
Gasparovic et al., "Use of tissue water as a concentration reference for proton spectroscopic imaging." Magnetic Resonance in Medicine, vol. 55(6), pp. 1219-1226 (2006).
International Search Report and Written Opinion of the International Searching Authority Corresponding to International application No. PCT/US 2021/049288 dated Dec. 15, 2021.

* cited by examiner

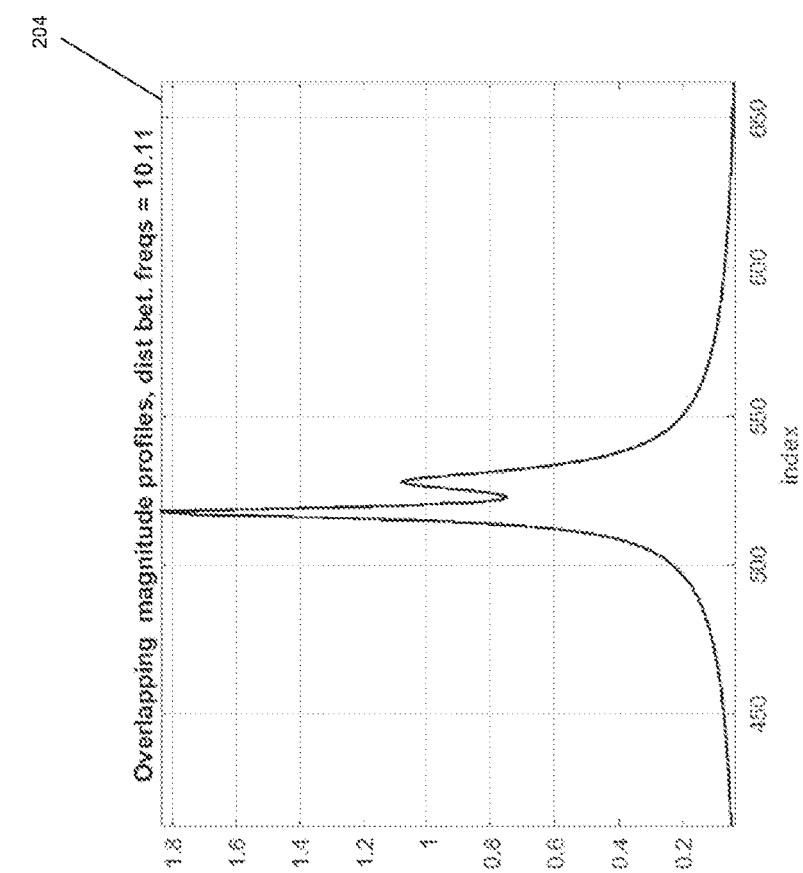
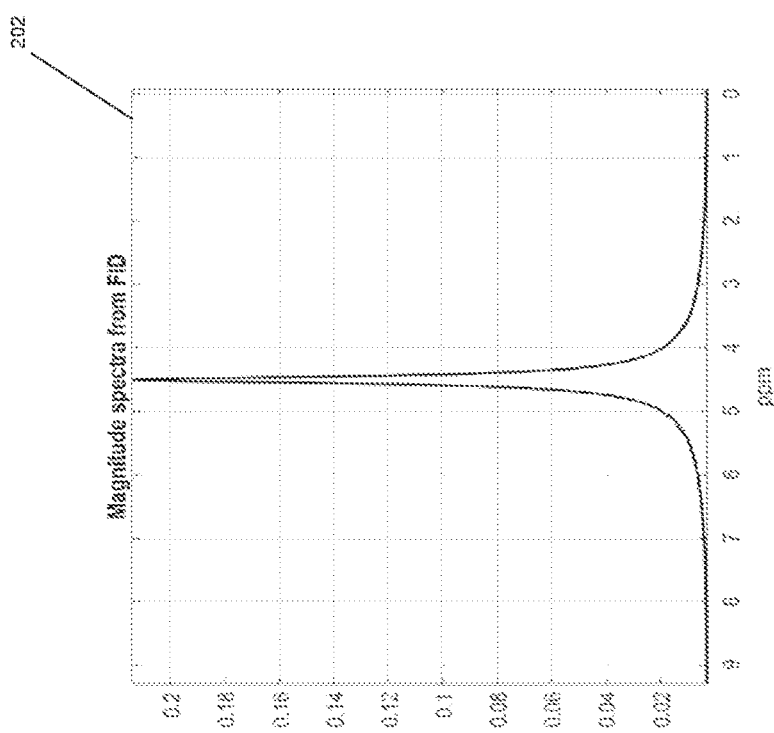
FIG. 2

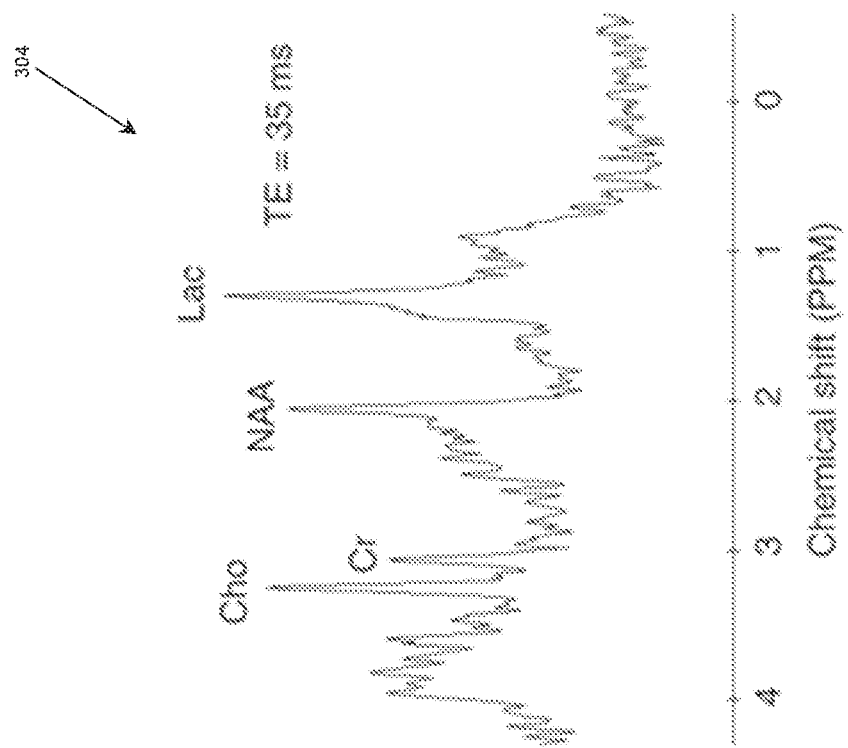
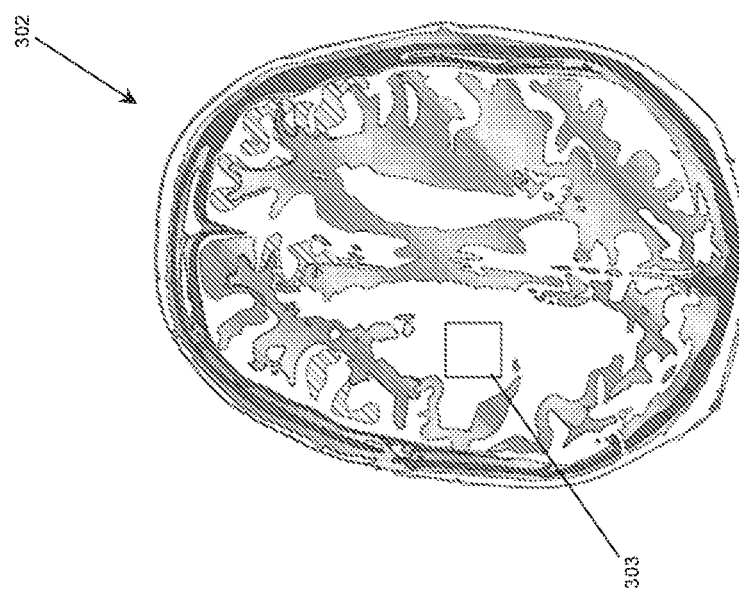
FIG. 3

| Name | Abbreviation | ppm location | Fit | Reference |
|---|---|---|---|---|
| Alanine | Ala | 1.466 (doublet)/3.773 | 3/1 | hmdb 161 |
| Choline | Cho | 3.189/3.500/4.06 | 9/2/2/ | |
| Creatine | Cr | 3.020/3.950 | 3/2 | hmdb 64 |
| Phosphocreatine | PCr | 3.029/3.930 | 4/1 | hmdb 01511 |
| γ-aminobutyrate | GABA | 1.889/2.283/3.003 | 2/2/2 | hmdb 112 |
| Glycerophosphocholine | GPC | 3.209/3.637/3.869/4.305 | 9/4/3/2 | hmdb 086 |
| Glutamate | Glu | 2.04/2.119/2.341/3.748 | 10/20/89/18 | hmdb 148 |
| Glutamine | Gln | 2.125/2.446/3.766 | 2/2/1 | hmdb |
| Glutamate+Glutamine | GLX | 2.0375 | 2/2 | |
| Glutathione | GSH | 2.155/2.532 | 2/3/1 | hmdb |
| Glycine | Gly | 2.973/3.782/4.292 | 2 | hmdb 123 |
| Lactate | Lac | 1.317/4.104 (doublet) | 3/1 | hmdb 211 |
| Myo-inositol | mIns-Ins | 3.56 (multiplet) | | hmdb 1365 |
| Phosphocholine | PC | 3.208/3.55-8/1.145 | 9/2/2 | hmdb 812 |
| N-acetyl-L-aspartate | NAA | 2.03/2.507/2.702/4.402/7.925 | 3/2/2/1/1 | hmdb 251 |
| Taurine | Tau | 3.252 (3)/3.411 (3) | 4/1 | |

FIG. 16

METHODS, SYSTEMS, AND COMPUTER READABLE MEDIA FOR UTILIZING SPECTRAL CIRCLES FOR MAGNETIC RESONANCE SPECTROSCOPY ANALYSIS

RELATED APPLICATIONS

This application is a U.S. National Stage entry of PCT International Patent Application No. PCT/US2021/049288, filed Sep. 7, 2021, which is incorporated by reference herein in its entirety, and which claims the benefit of U.S. Provisional Patent Application Ser. No. 63/074,867, filed Sep. 4, 2020; the disclosure of which is incorporated herein by reference in its entirety.

TECHNICAL FIELD

The subject matter described herein relates to improving the consistency and accuracy of magnetic resonance spectroscopy techniques. More particularly, the subject matter described herein relates to utilizing spectral circles for magnetic resonance spectroscopy analysis.

BACKGROUND

Magnetic Resonance Spectroscopy (MRS) is a non-invasive means of measuring metabolite concentrations within tissues that has vast clinical potential, especially for disorders within the central nervous system (CNS). At the same time, medicine desperately needs the clinical information imparted by MRS. Notably, MRS guidance could be invaluable for the treatment of patients diagnosed with malignant brain tumors. Further, MRS technology greatly benefits individuals with diseases that have oxidative stress or neural dysfunction (e.g., diabetes). More generally, the clinical usefulness of MRS (e.g., $^1$H MR spectroscopy) has been established for brain neoplasms, neonatal and pediatric disorders (e.g., hypoxia-ischemia, inherited metabolic diseases, traumatic brain injury, and the like), demyelinating disorders, and infectious brain lesions. The growing list of disorders for which MRS may contribute to patient management further extends to a number of neurodegenerative diseases, including epilepsy, and stroke.

MRS quantification of metabolomics has enormous potential in clinical medicine, but this information is currently underutilized in clinical practice due to limitations of existing technologies. For example, one prominent health insurance entity lists four disorders where MRS is "medically necessary" but also lists twenty-seven medical conditions where MRS could be applied but is not yet approved. Another publication notes that the utility of MRS in diagnosis and evaluation of treatment response to human brain tumors has been widely documented but that there is a need for standardization and further study in order for MRS to become widely used as a routine clinical tool. Increased usefulness and accuracy of MRS quantification of metabolites will lead to greater use for conditions with reliable MRS markers such as brain tumors, and better clinical research and ultimately market penetration for many conditions. Therefore, the impact of accurate, reproducible, easy to perform, automated MRS on clinical medicine and clinical trials will be significant.

Accordingly, there exists a need for improved methods, systems, and computer readable media for utilizing spectral circles for magnetic resonance spectroscopy analysis.

SUMMARY

A method for utilizing spectral circles for magnetic resonance spectroscopy analysis is presently disclosed herein. One exemplary method includes collecting magnetic resonance imaging (MRI) scanner data corresponding to a region of interest, establishing a spectral peak profile associated with at least one metabolite in the region of interest, wherein the spectral peak profile comprises a term in a spectrum of an FID vector signal included in the collected MRI scanner data, and selecting at least three counter indices and corresponding points on the spectral peak profile to compute a linear fractional transformation (LFT). The method further includes computing an N-dimensional vector outlining a spectral circle in a complex plane by applying the LFT to each counter index included in a set of equally-spaced counter indices associated with a three-dimensional spectrum representation of the collected MRI scanner data, shifting the spectral circle to eliminate a baseline offset for a magnitude spectrum associated with the complex plane, and rotating the shifted spectral circle to produce a rotated spectral circle, wherein a diameter of the rotated spectral circle is symmetric about a real axis in the complex plane and positioned on a positive section of the real axis. The method further includes identifying a dephased real part of a vector corresponding to the rotated spectral circle and estimating a concentration of the at least one metabolite in the region of interest by determining an area under the dephased real part of the vector.

According to another aspect of the method described herein, the spectral peak profile is three-dimensional.

According to another aspect of the method described herein, the at least three counter indices correspond to a respective at least three complex Fourier transform (DFT) values on the magnitude spectrum.

According to another aspect of the method described herein, the at least three counter indices are utilized to compute at least three unknown values to establish the LFT.

According to another aspect of the method described herein, the shifted spectral circle is rotated by subjecting the shifted spectral circle to a complex multiplication operation.

According to another aspect of the method described herein, the method further includes applying a noise reduction algorithm to the spectral peak profile in the event more than three frequency indices are selected.

According to another aspect of the method described herein, the FID vector signal is a complex valued vector.

According to another aspect of the subject matter presently disclosed herein, a system for utilizing spectral circles for magnetic resonance spectroscopy analysis includes a scanning device configured for MRI scanner device data corresponding to a region of interest. The system further includes a metabolite concentration assessment engine configured for receiving the collected MRI scanner device data, establishing a spectral peak profile associated with at least one metabolite in the region of interest, wherein the spectral peak profile comprises a term in a spectrum of an FID vector signal included in the collected MRI scanner data, selecting at least three counter indices and corresponding points on the spectral peak profile to compute an LFT, and computing an N-dimensional vector outlining a spectral circle in a complex plane by applying the LFT to each counter index included in a set of equally-spaced counter indices associated with a three-dimensional spectrum representation of the collected MRI scanner data. The system is further configured for shifting the spectral circle to eliminate a baseline offset for a magnitude spectrum associated with the complex plane, rotating the shifted spectral circle to produce a rotated spectral circle, wherein a diameter of the rotated spectral circle is symmetric about a real axis in the complex plane and positioned on a positive section of the real axis, identifying a dephased real part of a vector corresponding to the rotated spectral circle, and estimating a concentration of the at least one metabolite in the region of interest by determining an area under the dephased real part of the vector.

According to another aspect of the system described herein, the spectral peak profile is three-dimensional.

According to another aspect of the system described herein, the at least three counter indices correspond to a respective at least three complex discrete Fourier transform values on the magnitude spectrum.

According to another aspect of the system described herein, the at least three counter indices and corresponding points are utilized to compute at least three unknown values to establish the LFT.

According to another aspect of the system described herein, the shifted spectral circle is rotated by subjecting the shifted spectral circle to a complex multiplication operation.

According to another aspect of the system described herein, wherein the metabolite assessment engine is further configured for applying a noise reduction algorithm to the spectral peak profile in the event more than three frequency indices are selected.

According to another aspect of the system described herein, the FID vector signal is a complex valued vector.

The subject matter described herein may be implemented in hardware, software, firmware, or any combination thereof. As such, the terms "function" "node", "engine" or "module" as used herein refer to hardware, which may also include software and/or firmware components, for implementing the feature being described. In one exemplary implementation, the subject matter described herein may be implemented using a computer readable medium having stored thereon computer executable instructions that when executed by the processor of a computer control the computer to perform steps. Exemplary computer readable media suitable for implementing the subject matter described herein include non-transitory computer-readable media, such as disk memory devices, chip memory devices, programmable logic devices, and application specific integrated circuits. In addition, a computer readable medium that implements the subject matter described herein may be located on a single device or computing platform or may be distributed across multiple devices or computing platforms.

An object of the presently disclosed subject matter having been stated hereinabove, and which is achieved in whole or in part by the presently disclosed subject matter, other objects will become evident as the description proceeds hereinbelow.

BRIEF DESCRIPTION OF THE DRAWINGS

The subject matter described herein will now be explained with reference to the accompanying drawings of which:

FIG. 2 includes graphs illustrating a centered discrete Fourier transform (DFTc) magnitude spectral profile of a free induction decay (FID) term and an spectral profile with overlap according to an embodiment of the subject matter described herein;

FIG. 3 depicts a magnetic resonance imaging (MRI) scan image of a brain slice and a labeled magnetic resonance spectroscopy (MRS) spectrum plot according to an embodiment of the subject matter described herein;

FIG. 16 depicts a table of magnetic resonance imaging (MRI) visible protons for spectral profiles corresponding to a plurality of metabolites according to an embodiment of the subject matter described herein.

DETAILED DESCRIPTION

Figure 1:
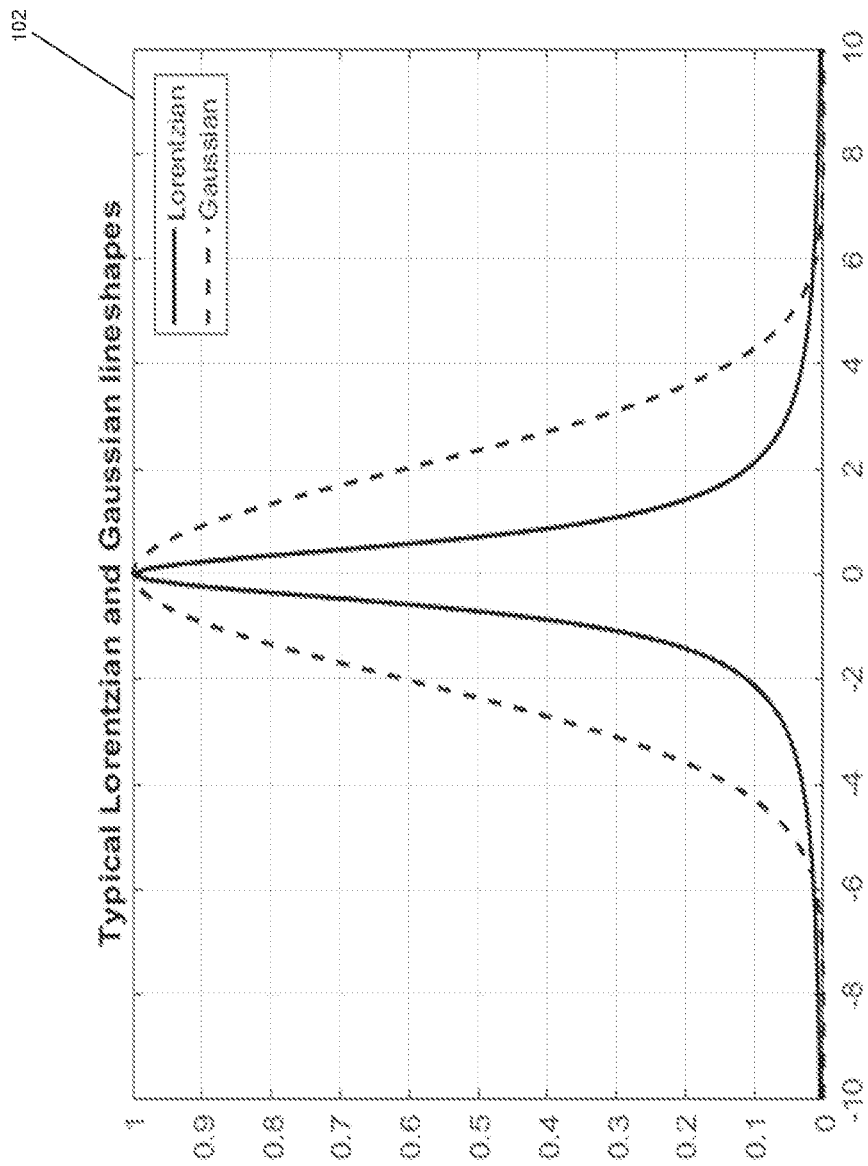
FIG. 1 is a graph illustrating typical Gaussian and Lorentzian lineshape plots.

The presently disclosed subject matter will now be described more fully. The presently disclosed subject matter can, however, be embodied in different forms and should not be construed as limited to the embodiments set forth herein below and in the accompanying examples. Rather, these embodiments are provided so that this disclosure will be thorough and complete, and will fully convey the scope of the embodiments to those skilled in the art.

The subject matter described herein relates to methods, systems, and computer readable media for utilizing spectral circles to conduct enhanced magnetic resonance spectroscopy (MRS) analysis. Notably, the disclosed subject matter describes the innovations in a novel method for MR Spectroscopy that is labeled 'mdMRS', an acronym that indicates the method is intended to be sufficiently accurate and consistent for clinicians who are primarily medical doctors (i.e., prefix "md" stands for "medical doctors").

In order for the use of MRS to be more widely accepted in clinical environments, there is a need for MRS software to provide rapid metabolite quantification that is accurate across hospitals and scanners. In some aspects, the disclosed subject matter addresses problems with reproducibility and applicability of MRS quantitation. By way of example and not limitation, the novel mdMRS methodology disclosed herein is innovative and overcomes the problems of baseline shift and the inability to separate closely spaced spectral profiles that limit current MRS software packages (e.g., LCModel, jMRUI, and other software). For example, in prior methods, the spectrum of the FID is computed using the standard DFT (as in LCModel). In other methods (e.g., jMRUI software), the spectrum is not computed and information is extracted from FID time vector. Specifically, these software applications have problems with two main aspects of MRS analysis related to closely spaced spectral profiles found in patient data: (i) baseline offset, where part of the spectral profile magnitude is buoyed up by a nearby spectral profile, and (ii) an inability to separate closely spaced spectral profiles, making it difficult to determine concentrations of many metabolites. Using the presently disclosed mdMRS methodology, both difficulties are solved.

Moreover, the presently disclosed mdMRS methodology differs from previous MRS analysis methods (e.g., the "CFIT" method) that utilize the spectra of an FID signal to resemble circular shapes, similar to aspects of mdMRS. Namely, such method uses a time-consuming gradient descent algorithm to minimize a complicated energy integral to find the circle that was used for their "CFIT" MRS analysis. In contrast, the disclosed subject matter utilizes novel algorithms based on stereographic projection to compute the energy integral more quickly and in a more efficient manner. Also, previous techniques did not consider the problems presented by closely spaced spectral profiles. As such, another critical difference and improvement over previous methods including the CFIT method is that the presently disclosed subject matter can solve the overlapping spectral profile problem in most cases. It is assumed that the spectral profiles in previous methods are isolated, which is marginally valid for only a few metabolites, and ignores data from the more interesting and biologically active metabolites in small concentrations. Further, the presently disclosed mdMRS methodology may also be compared to 2D NMR Spectroscopy that uses correlation spectroscopy (COSY) and is able to separate overlapping spectral profiles. However, the COSY-related method requires long data collection times and a prohibitively large amount of data storage.

In general, the collection of data for MR spectroscopy can be accomplished using standard MRI scanner devices. As such, MRI systems are already in place around the world to collect the data needed. In addition, some companies are currently developing portable MRI scanners for mobile applications and can be brought to a patient's bedside. Consequently, it may become more convenient and common to collect MRS data from patients.

As indicated above, despite the enormous potential of MRS, many clinicians are not ready to accept that MRS is sufficiently consistent or accurate for many of its possible applications. However, several studies have demonstrated the apparent need for increased accuracy and consistency in MRS. Accordingly, the disclosed methods of mdMRS can provide the needed accuracy and consistency with an entirely novel process that analyzes key spectral features using the full data available, and does not ignore aspects of that data. Moreover, prior methods for analyzing MRS data, such as those available in software like LCModel, do not use the full data obtained from the MR scanner. These methods use only a traditional one-dimensional (1D) spectrum made of the magnitude of the standard spectrum of the data collected. Further, the data used for MRS is output from the scanner in a three-dimensional (3D) form. In particular, scanners from vendors typically provide output in the form of a vector comprising a 1D index vector and an associated set of a 2D complex numbers. This vector is the "Free Induction Decay (FID)" signal that contains information from all the compounds in the region of the scan.

The form of a single term in an FID signal s(t), a function of time t, is given by the following equation:

$$s(t) = Ae^{-t/T2^*}e^{i(2\pi vt + \varphi)}$$

which is a damped complex exponential that depends on four (real-valued) characteristics: amplitude A, damping constant T*, frequency ν, and phase angle φ.

The data for MR Spectroscopy is a sum of a large number of terms of the form given by the above equation for s(t). For digital computation, the signal is sampled at regular intervals, such that s(t) becomes s(nT) for n=1, ..., N. The result is a vector of length N whose entries include complex numbers.

Each complex value in the FID vector has both a real part x and an "imaginary" part y, which are combined together as one complex value z=x+iy, where i is a fictitious value equal to $\sqrt{-1}$ that is useful for defining a multiplication of complex values. The spectrum of the FID is also complex-valued. The magnitude of each complex value is $\sqrt{x^2+y^2}$ and is one-dimensional (1D), i.e., basically the hypotenuse of a right triangle with sides of length x and y. It is the magnitude spectrum that is used by prior methods. However, in the disclosed mdMRS method, complex values are used in their entirety. Spectral images are plotted in 3D, with the complex term's real part on a horizontal axis and the "imaginary" part vertical to it. In contrast, prior methods use only the hypotenuse and ignore the lengths of the sides. Rather than work with the 1D magnitude of the spectrum, the mdMRS method utilizes full 3D data for analysis. As a result, improved accuracy is attained when using the full data set for analysis.

The word "spectroscopy" as used in the term "MR Spectroscopy" relates to the spectrum of the FID output of the scanner. Notably, current MR Spectroscopy methods compute that spectrum using the Discrete Fourier Transform (DFT) in standard form. The literature is full of statements about whether the resulting individual spectrum of a particular metabolite is "Gaussian" or "Lorentzian." To further illustrate, FIG. 1 presents a graphical plot 102 that depicts typical Gaussian and Lorentzian lineshapes. Notably, there is no need for this distinction in mdMRS.

In some embodiments, the disclosed subject matter presents the mdMRS method employing a unique and useful modification of the standard DFT to overcome the problem mentioned above. The definition of the standard DFT, X[k], of vector x[n], n=1, ..., N, uses the "one-sided" sum shown below:

$$X[k] = \sum_{n=0}^{N-1} x[n]e^{\left(-\frac{2\pi i}{N}kn\right)}/\sqrt{N}$$

for k=0, ..., N.

In some embodiments, a centered DFT (DFTc) can be described as having special properties, such as a unique set of eigenvectors. Notably, this is a property not possessed by the standard DFT. The DFTc provides consistency in the form of the spectra of each metabolite, as described below.

In some embodiments, the definition of the DFTc of vector x is presented in the equation below. It represents a sum that is symmetric rather than one-sided.

$$X_c[k] = \sum_{n=-(N-1)/2}^{(N-1)/2} x[n] e^{\left(\frac{2\pi i}{N} n(k-(N-1)/2)\right)} \sqrt{N}$$

for k=0, ..., N−1. The DFTc of an FID containing a single frequency has a stable, simple form, as is further illustrated in FIG. 2. More specifically, graph 202 in FIG. 2 depicts an exemplary DFTc magnitude spectral profile (e.g., a consistent magnitude spectra form of an FID).

It is also noted that MR Spectroscopy has the advantage of being a completely non-invasive method that can provide clinicians with information about compound concentrations, such as for metabolites present in the brain. However, data collected from a living being typically suffers more distortions as opposed to data collected in an NMR study of a sample in a container. In particular, the data contains more noise, and the spectral profiles of individual metabolites often overlap each other. Two exemplary overlapping spectral profiles are depicted in graph 204 of FIG. 2. The magnetic fields that can be used for scans of people are not at the same strength as those used for samples in a tube, thereby resulting in less spectral differentiation. The spectral overlap makes it difficult to determine the concentration amounts for each of the metabolites whose spectral profiles overlap. The decay rate of the FID signal creates a magnitude spectral profile that has long "tails" that do not reach the frequency axis quickly as shown in graph 202 in FIG. 2. Those tails affect the profiles of nearby spectral profiles, notably raising the profiles above the horizontal axis further than the peaks would be if they were isolated. This can be termed a "buoyant" effect, since one profile may effectively raise up other nearby (i.e., closely situated) profiles.

Consequently, this buoyant effect makes it difficult to determine the actual height of a spectral profile. More specifically, the highest point on the spectral profile may be lower than the computed spectrum would suggest. Yet that height is involved in prior MR Spectroscopy methods in determining concentration. Prior MR Spectroscopy methods have been known to employ complicated least squares minimization methods in an attempt to correct this deficiency in measurement.

During the application of MR Spectroscopy to a subject, a region of the brain or other part of the body is selected as a region of interest (ROI). Image 302 of FIG. 3 depicts a ROI in the human brain and presents an outline of a square 303, which represents a voxel in that region. MR Spectroscopy can be either single voxel or multi-voxel. The mdMRS method of the disclosed subject matter covers both cases. Further, plot 304 of FIG. 3 depicts a labeled MRS magnitude spectrum.

Generally speaking, the initial data obtained from the MRI scanner is a collection of a large number of FID vectors from the same voxel. A typical number of FID vectors is a power of two, such as 256 or 512. In some instances, this data from the scanner is collected using an H2O suppressed protocol.

The set of FID data from a particular voxel can be averaged to diminish noise, i.e., one method of denoising. The resulting denoised vector typically comprises 1024 time samples. For the multi-voxel case, this process is repeated for all the voxels in the ROI. The total time the patient is in the scanner for MR Spectroscopy is generally less than ten minutes.

For use as a reference for concentration determination, a smaller number of FID vectors of non-suppressed H2O data can be collected from the same voxel. The collected data is averaged again in order to diminish noise and is subsequently used as a single FID reference signal. It is further noted that the higher the strength of the magnetic field, the more detailed the spectrum. Returning to FIG. 3, image 302 shows a voxel that is selected from a subject's brain along with the standard DFT magnitude spectrum of the FID from that voxel. Notably, image 302 is an MRI brain slice image produced from a 3T scanner.

In some embodiments, the presently disclosed subject matter includes a novel set of algorithms for MRS, described in additional detail below. Notably, the algorithms are based on the three-dimensional (3D) nature of MRS data that i) eliminates spectral baseline shift, ii) mitigates analysis of the closely spaced spectral profiles typical in MRS patient data, and iii) simplifies the computation of a metabolite's spectral content for more accurate estimates of metabolite concentrations. The development and refinement of the new mdMRS software algorithms and/or programs includes comparing its output to known values of simulated data and to output of existing software for MRS using data for different types of input data. Further, in the MRS literature, authors are typically not precise about their use of the word "curve." This term is important since the concentration of a metabolite is determined by, among other things, the area under a specific spectral curve: the "dephased real part," as described in the following.

In some embodiments, the mdMRS algorithm(s) can be embodied as a software process and/or software computer program, that is stored in memory of computing device and subsequently executed by one or more hardware processors of the computing device. In some embodiments, the presently disclosed mdMRS process(es) can be executed by an "mdMRS engine" and/or "metabolite concentration assessment engine" that is executed by one or more hardware processors of a stand-alone metabolite concentration assessment device that is communicatively connected to each of an MRI scanner and a display unit.

Figure 4:
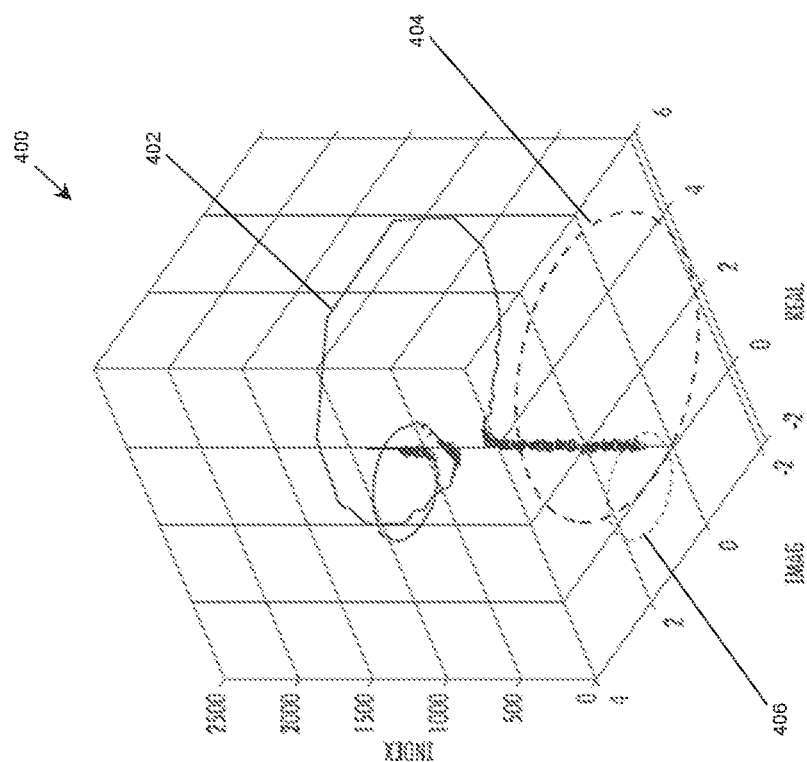
FIG. 4 depicts an exemplary three dimensional (3D) spectrum and its projection to the complex plane according to an embodiment of the subject matter described herein.

As indicated above, the MRS data from an MRI scanner device is actually three-dimensional (3D). For example, in plot 400 in FIG. 4 illustrates a 3D spectrum signal 402 and its projection (i.e., circle 404 and circle 406) in the complex plane. Notably, there is no overlap in the 3D version. Writing the 3D coordinates in the familiar (x,y,z) form, those three parameters/variables refer to the vector that is the centered Discrete Fourier Transform (DFT) of the FID data, such that (x,y,z)=(real(DFT), imag(DFT), k), where k is the frequency index. Complex numbers have many benefits for signal and image analysis. The frequency index, k, ranges from 1 to 1024 for most scanner outputs. Alternatively, k can be expressed in units of parts per million (ppm). Showing figures as 3D graphs (as shown in FIG. 4) would be unfamiliar (i.e., largely unusable) to clinicians so that the curves used to represent the DFT in MRS are generally represented in a 2D space. However, it should be noted that all such figures are derived from the 3D DFT spectrum.

In some embodiments, there are three types of spectral "curves" used in mdMRS. Notably, two of these spectral curves are standard in current MRS. The first type of spectral curve is a curve that is the magnitude of the spectrum (DFT), denoted |DFT|, meaning an absolute value. Using k as a frequency index, where 1≤k≤N and where N is a power of 2 such as 1,024, the magnitude spectrum is 2D with (x, y)=(k,$\sqrt{\text{real}(DFT(k))^2+\text{imag}(DFT(k))^2}$)). In some embodiments, this form can be used to display a spectrum of an arbitrary input vector in biosignal analysis.

The second type of spectral curve includes a 'dephased real part' of the DFT. More specifically, the 'dephased real part' of the DFT is the most useful curve for MRS, since the area represented under this form is proportional to the number of resonant protons for a spectral profile of a given metabolite. In particular, the shape of a dephased real part curve can be characterized as a "Lorentzian" shape (as described above and illustrated in FIG. 1). MRS researchers often use the term "lineshape" to relate to this curve, which has the symmetrical shape of a graph of a curve with equation $y=1/(1+x^2)$.

The third type of spectral curve is a curve that is specific to the analysis in mdMRS. Notably, this is a curve that lies totally within the complex plane given by (x,y)=(real(DFT), imag(DFT)). This curve is the projection of the 3D DFT to the complex plane, and does not include the frequency index k. While this is a non-standard way of viewing the spectrum, this projection gives additional insight into the spectrum of the DFT of an FID signal. It is not standard in MRS analysis, but operating with the spectrum in the complex plane brings out many features of the spectrum, such as the (discrete) circular shape of an isolated FID signal and a way to readily (i) remove a baseline offset and (ii) determine the dephased real part curves.

In some embodiments, it has been determined that although the frequency index k does not appear in the complex spectrum, there is a simple way to relate a spectral circle (e.g., an 'sCircle') to the set of indices that produce it. Notably, the method is called a Linear Fractional Transform (LFT), which is a function used in complex analysis. It is also convenient to compute the inverse of an LFT, so relevant analysis can promptly discover the special indices that correspond directly to key points, such as the two full-width, half maximum (FWHM) points on a |DFT| curve. From these points on this curve, one can determine the damping constant of the FID signal.

In some embodiments, the mdMRS methodology can be conducted as a three-step process or method. Namely, a first step may include determining the metabolites of interest. For example, a user may specify metabolites for analysis by choosing one or more specific metabolites for concentration and/or area analysis. This step differs from previous MRS analysis methods that require the user to select a large set of metabolites for "curve fitting" to the magnitude spectrum.

In the second step, peak indices are identified. For example, the method can label the frequency indices that produce peaks in the magnitude spectrum as "peak indices". For a particular metabolite, these may be known or identified from NMR research. For example, for N-acetyl-aspartate (NAA), the peak indices are located at 2.03, 2.507, 2.702, and 4.402 ppm for peaks in the magnitude spectrum. The corresponding shape of the magnitude spectrum is called the "peak profile."

The third step involves the aforementioned LFT transformations. In some embodiments, LFTs provide a forward and inverse transform between lines (such as the frequency axis) and circles (such as an FID spectrum). In some embodiments, LFTs can be represented as simple 2×2 matrices that are determined by three pairs of points, such as three indices and their images on an sCircle. For example, using the LFT matrix for a chosen sProfile, the unique value may be found for that sProfile that can be used to shift it in order to remove the baseline offset of the associated isolated MRS spectra, and subsequently obtain resolved magnitude spectra. In some embodiments, the baseline offset can be calculated as the minimum distance from the origin to the spectral circle. After shifting the sCircle, another unique value may be found for a rotation of that sCircle that leads directly to the "dephased real spectrum", which is the visual realization usually shown in output graphs to clinicians. The dephased real parts (dePhRe) profiles are easily obtained after the sCircle rotation. Those dePhRe profiles are important because the dePhRe spectrum has area (and amplitude) proportional to the area under that profile, and area is the traditional measure of the 'intensity' of the profile used for concentration determination.

In some embodiments, a LFT or "Moebius transformation" is a function of complex variables defined by the formula, $w=(a*z+b)/(c*z+d)$, where the variables z and w are complex numbers. Similarly, the constants a, b, c, and d are complex numbers. Further, LFTs can be used to map lines and/or circles in the z-plane to lines and/or circles existing in the w-plane. Notably, although there are four constants indicated in the above definition of an LFT, one of those constants can be eliminated via division by one of them, such that the LFT only depends on three (complex) constants, which are illustrated herein as being a, b, and d.

To practically illustrate the above, the actual three-step mdMRS method as it can be applied to each peak profile (pProfile) is described herein. The first step (e.g., 'step 1') includes the selection of three or more frequency indices that map to that pProfile. These frequency indices can be designated as ($k_1$, $k_2$, $k_3$). For noise suppression, it is ideal to select indices that are close to the peak index, but any three indices that map to the peak profile will suffice. Notably, these frequency indices respectively correspond to three complex DFT values on the magnitude spectrum. As such, the three points in the plane are denoted as ($k_i$,DFT($k_i$)), for $1 \le i \le 3$. These three points can be used to compute the three unknowns, e.g., (a,b,d), to completely determine the LFT that maps the three frequency indices to the corresponding points in the complex plane. The determined LFT is then applied to all indices (i.e., counter values), $1 \le k \le N$ In some embodiments, the counter values and/or counter indices are typically equally spaced integer values ranging from 1 to 1024. The result is a vector representing the spectral Circle (sCircle) for that peak profile (e.g., a vector of samples outlining the associated sCircle in the complex plane).

The second step (e.g., 'step 2') includes shifting the sCircle via complex subtraction of a special constant related to the LFT from the first step, such that the sCircle traverses through the origin in the complex plane. That is, compute w=z−A, for all z values on the sCircle and for a constant A. In some embodiments, the constant A may be variable 'a' from the LFT that is described as above as W=(az−b)/(cz+d). This shifting eliminates the "baseline offset" familiar as a problem to MRS analysis. Moreover, in some embodiments, the shifting of the sCircle may constitute an optional step.

The third step (e.g., 'step 3') includes rotating the (discrete) sCircle as shifted in step 2 by a particular angle φ such that i) the sCircle is symmetric about the real axis, ii) the sCircle passes through the origin, and iii) the diameter of sCircle is positioned on the positive real axis. The rotation can be performed by complex multiplication, $w=e^{i\phi}z$. Notably, the real part of the resulting vector is identified as the 'dephased real part', which is important to metabolite concentration determination. Afterwards, the area under that curve can be determined by numerical integration (e.g., using the trapezoidal rule), such that the calculation can be performed without knowing any of the four spectral characteristics of the FID signal.

In some embodiments, the amplitude of the FID signal has been found to be equal to half the value of the area under the curve. Further, the area under the curve is used for metabolite concentration. More specifically, the relationship between the FID signal amplitude (Amp) and the area under the dephased real part Area(dePhRe), whose symmetric shape is sometimes called a Lorentzian curve, can be represented as Area(dePhRe)=Amp/2. Because of this formula, ratios of areas of the dephased real part are the same as ratios of amplitudes. Previously, researchers have used this area for concentration determination in MRS analysis, rather than using the area under the magnitude spectrum, which has a slightly more complicated relation to amplitude and is difficult to compute.

Alternatively, Area(dePhRe)=2*π*Radius*FWHM where the 'Radius' is that of the spectral circle and is something that can be computed when the equation for the spectral circle is determined at the initial step. FWHM represents the "full width half maximum that is the width of the dePhRe shape at the level that is half of its maximum. The FWHM is often used to characterize the width of a spectral shape. FWHM can be determined by finding the two points FW1 and FW2 (where FW1<FW2) that are on the real dephased part at the half maximum level.

Figure 5:
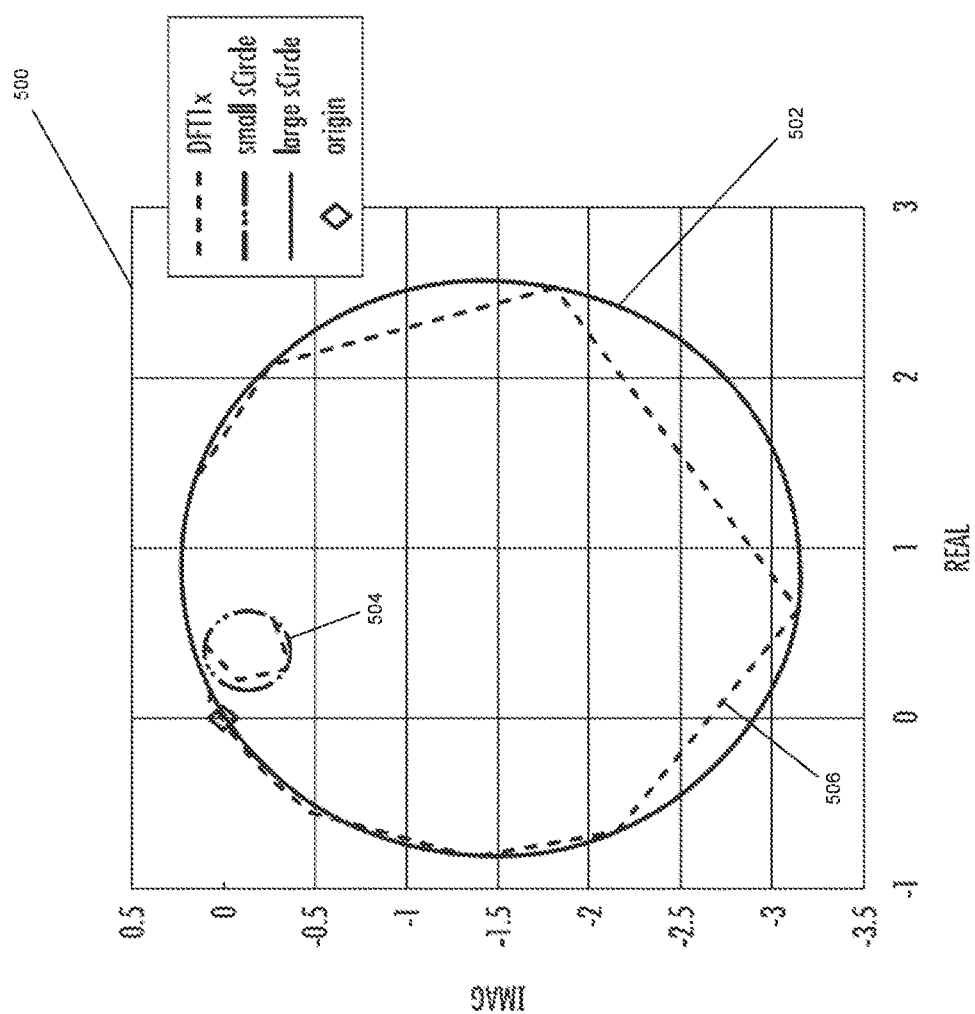
FIG. 5 includes a graphical illustration of associated spectral circles in the complex plane according to an embodiment of the subject matter described herein.
Figure 6:
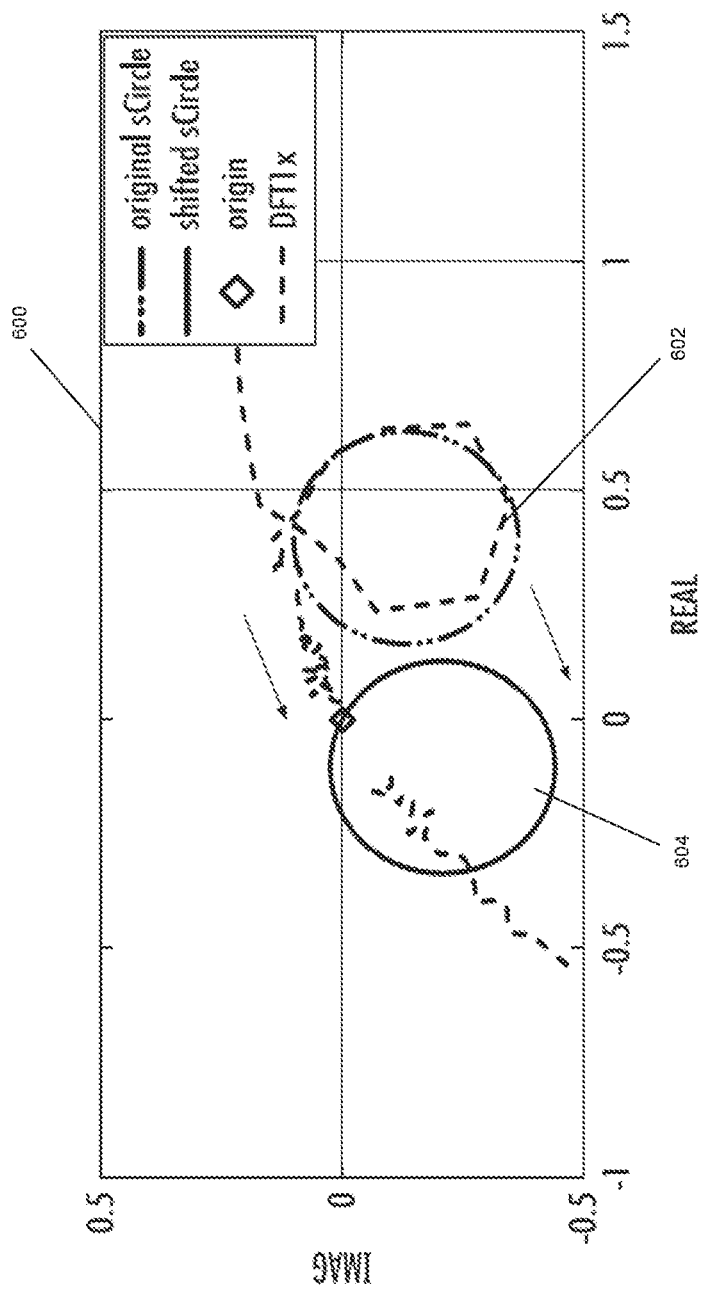
FIG. 6 includes a graphical illustration of shifting a spectral circle in the complex plane according to an embodiment of the subject matter described herein.

FIGS. 5-8 collectively present a graphical illustration of the above three-step method of mdMRS for determining the area of the dephased real part of a term in the FID spectrum from Magnetic Resonance Spectroscopy data. For example, graph 500 in FIG. 5 illustrates two spectral circles (i.e., one large circle 502 and one small circle 504) along with the DFT plot 506 that is the sum of the two associated terms of an FID. In graph 600 of FIG. 6, "step 2" is illustrated as focusing on the smaller spectral circle, which does not go through the origin (i.e., diamond) because of the larger circle's influence. This step shifts the original spectral circle 602 so that the resulting circle 604 passes through the origin. Notably, this operation is represented as w=z−a, and eliminates baseline shift.

Figure 7:
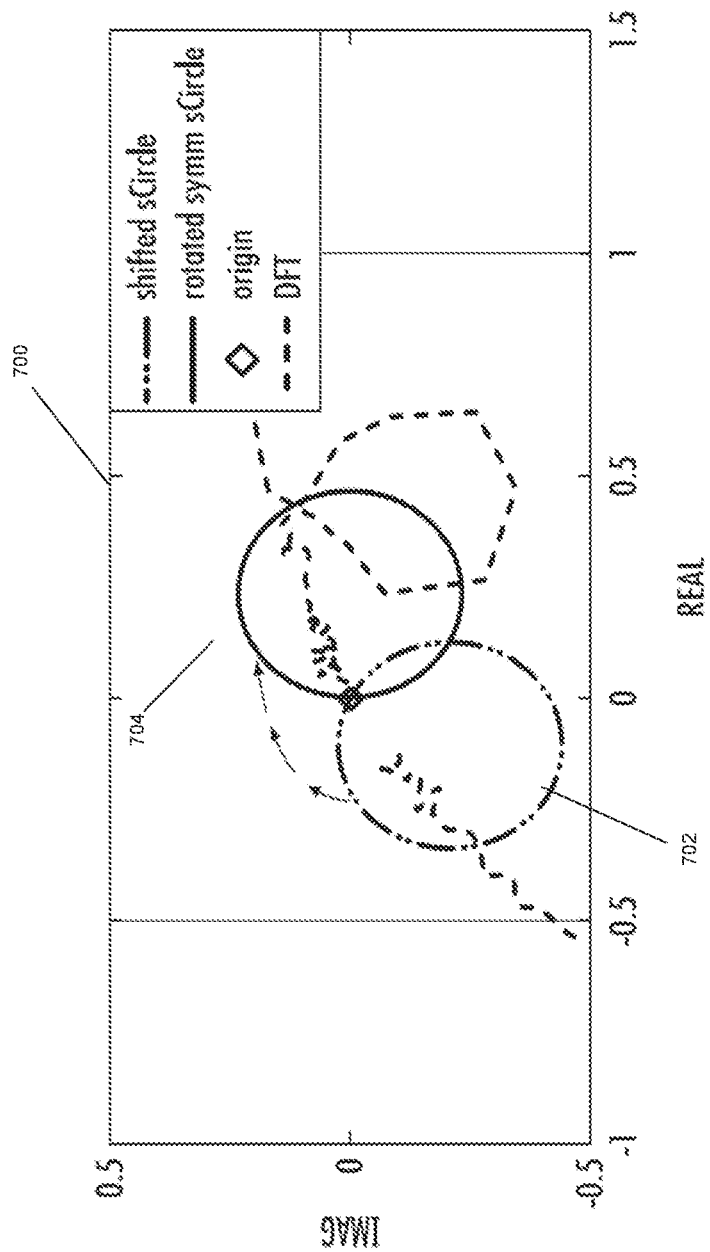
FIG. 7 includes a graphical illustration of rotating a shifted spectral circle in the complex plane according to an embodiment of the subject matter described herein.

Graph 700 in FIG. 7 illustrates "step 3" where the shifted circle of step 2 (and shown in FIG. 7 as circle 702) is rotated by an angular amount so that the resulting circle 704 is symmetric about the real axis with its diameter positioned on the real axis. In some embodiments, this rotation operation is represented as $w=e^{im}z$, where m represents the angle of rotation.

Figure 8:
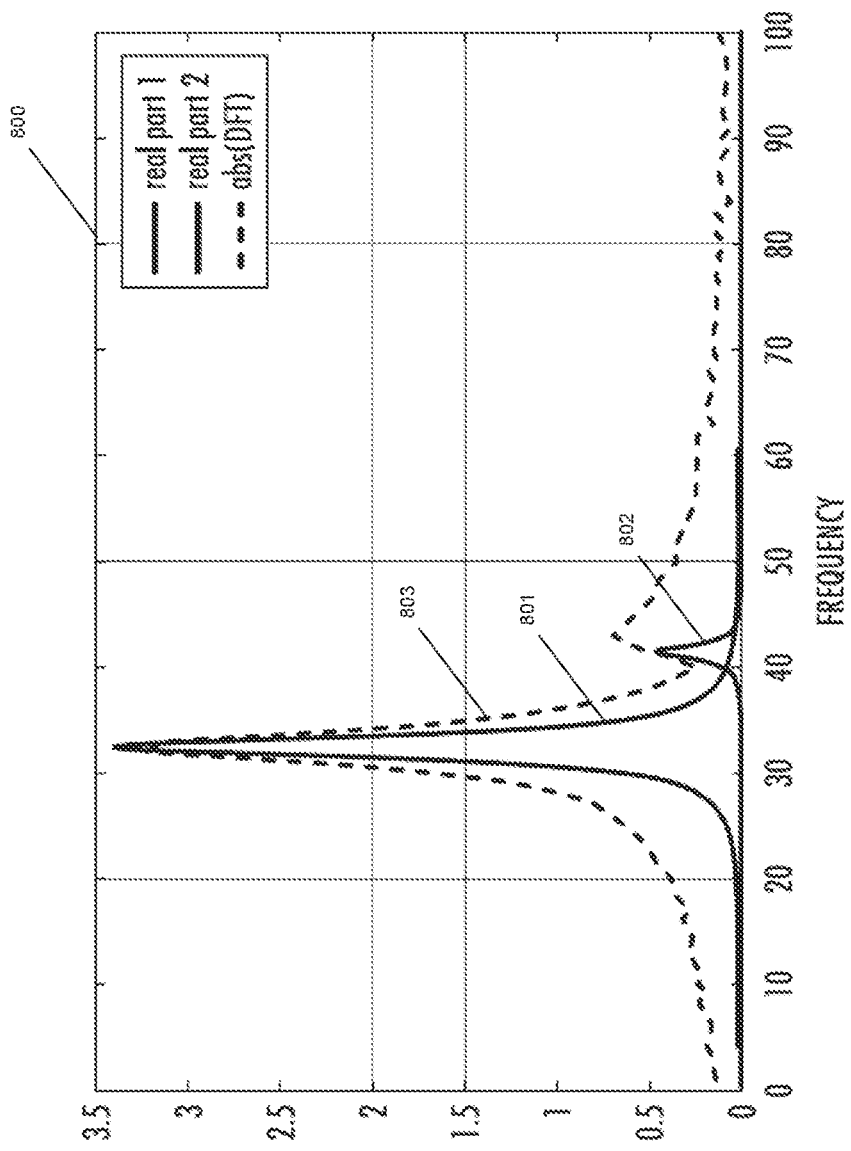
FIG. 8 includes a graph illustrating dephased real parts of a rotated spectral circle and an associated discrete Fourier transform (DFT) depicted in the complex spectrum according to an embodiment of the subject matter described herein.

Graph 800 in FIG. 8 illustrates a plot that shows the taking of the real part of the resulting circle of step 3, which in turn results in the "dephased real parts" (e.g., solid plot lines 801 and 802). Graph 800 further illustrates the overlay of the magnitude spectrum plot line 803. It is also noted that the lower right part of the FIG. 8 is an illustrative example of a fault in the magnitude spectrum. Namely, the apparent peak of the smaller term magnitude spectrum plot line 803 is positioned around index 43, but the actual peak for the smaller part is illustrated correctly at 41.5, which is the peak of the isolated dephased real part (i.e., plot line 802).

It should also be noted the amount of computation needed to execute the 3-step method is quite minimal. As introduced above, the algorithm computes values a, b, and d for the LFT given by w=(a z+b)/(z+d) from three or more data points on the spectral circle. Afterwards, the algorithm computes w=z−a, where 'a' is the first term in the LFT. Lastly, the algorithm computes $w=e^{im}z$ where 'm' is the angle of rotation. Using this equation, the algorithm can take the real part and find the area under that curve. Notably, the 3-step method is performed for each spectral profile for each metabolite of interest.

In some embodiments, the mdMRS methodology can be performed utilizing a formula that is representative of the area of a FID term's dephased real part from the LFT that determines the spectral circle. Notably, the analysis uses the 3-step method, but the formula proceeds directly from the initial step to the needed area value. For example, the form of the LFT can be w=(a z+b)/(c z+d) where z and w are complex variables, and a, b, c, and d are complex constants. In some embodiments, the algorithm can set c=1 for the computations, such that the LFT then only depends on three values. For example, if (z1, w1) is a point in the plane on that circle, then w1=(a z1+b)(z1+d). For noisy data, results may be improved by using additional data points on that circle exhibiting noise.

Further, a system of equations can be used to compute a, b, and d. For example, suppose (z1,w1), (z2, w2), . . . (zn, wn) represent 'n' points on the circle. To determine the values of a, b, and d in the LFT, it follows from the LFT form above that those values need to satisfy the equation:

$$-a\, z_k - b + dW_k = -z_k w_k$$

for k=1, 2, . . . , n. Solving this system (with a pseudo-inverse for more than three points) determines the LFT.

In some embodiments, one method to perform the computation is to combine the steps outlined above and simply solve for the area of the "dephased real part" based on the three values defining the LFT. Once the three values (a,b,d) are determined for the LFT of a spectral circle, the area under the dephased real part is determined by the formula:

$$\text{Area}_{dephased\ Real}\text{Real}=2\pi|ad-b|,$$

where |ad−b| is the absolute value of a times d minus b and each of those constants are complex-valued. This formula goes straight from the LFT to the area value that is needed for metabolite concentration. It is based on the graphical interpretation of the 3-step method described above, but this embodiment of the mdMRS methodology only requires one step.

In some embodiments, the mdMRS method can also be utilized to produce an accurate amplitude estimation from noisy data. Although three points can be used to determine an sCircle, the accuracy of amplitude estimates from noisy data benefit from using more than three data points for this computation. Notably, a novel method has been created that involves a "Moore-Penrose" approach or "pseudoinverse" of a matrix related to the LFT. For example, the Moore-Penrose approach includes a "best fit" of the data that requires minimal computation and its use dampens the effect of noise on amplitude estimates. Further, the determined amplitudes lead directly to metabolite concentration estimates. In at least one practical implementation, zero padding may be applied/increased to 4× after white Gaussian noise is induced in the FID signal with SNR=5 Similarly, wavelength noise reduction using the sym4 wavelet can be applied. The most effective noise reduction method applied involves the aforementioned pseudoinverse algorithm. This algorithm is applied to a linear system that includes more than three data points on the spectral profile. For very noisy data, more than three data points should be used in step one of the three-step method described above.

Figure 9:
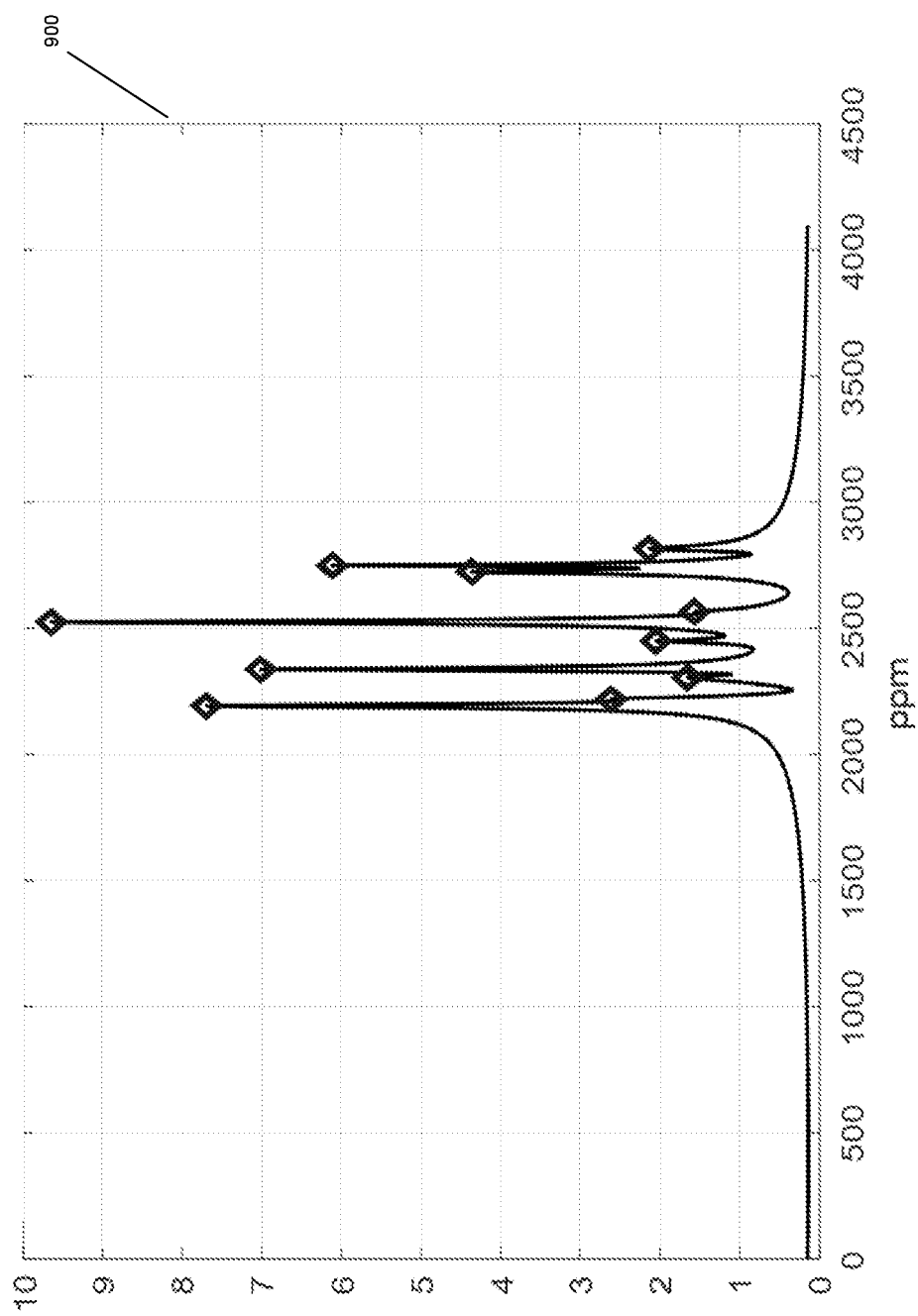
FIG. 9 is a graph depicting an exemplary magnitude spectrum for a simulated FID signal according to an embodiment of the subject matter described herein.
Figure 10:
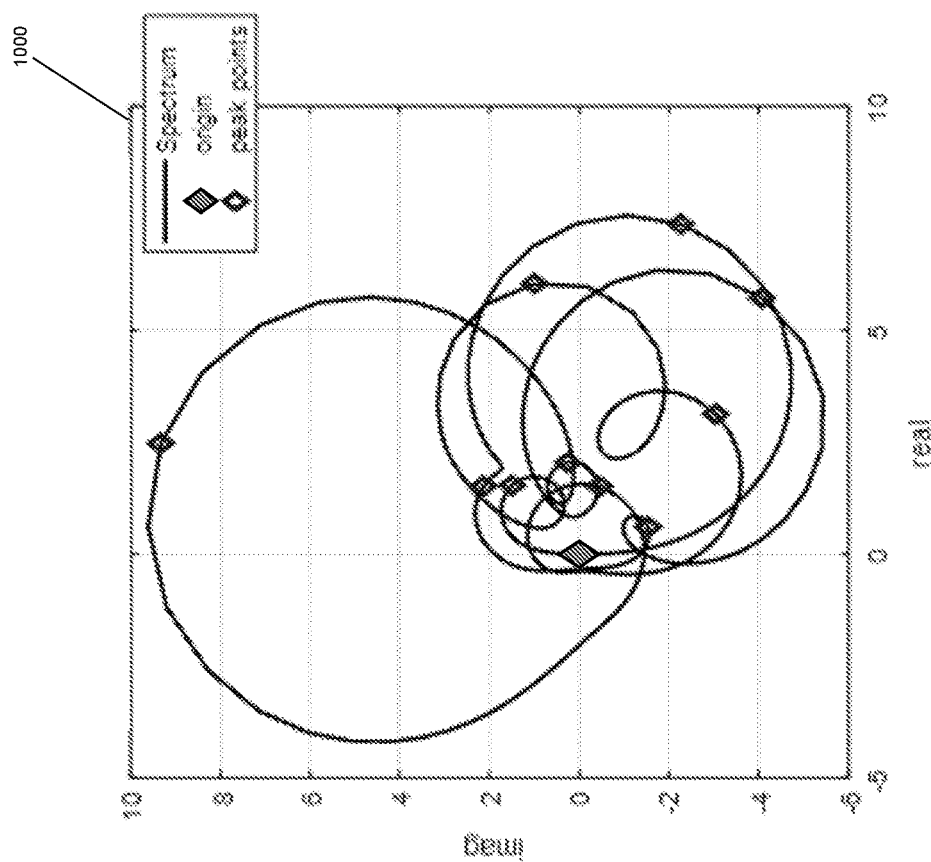
FIG. 10 is a graph depicting the simulated FID signal visualized in an exemplary complex spectrum according to an embodiment of the subject matter described herein.

To illustrate an exemplary execution of the mdMRS analysis, a simulated FID containing ten (10) individual terms is presented below. Specifically, in FIG. 9, the magnitude spectrum of an FID consisting of ten individual spectral Profiles (sProfiles) using simulated data is shown in graph 900. The spectral magnitude is a traditional form of visualizing spectra. Notably, this spectrum includes spectral profiles (sProfiles) that overlap and have a variety of heights and widths, similar to the spectra of phantom data that is available in tests. Note the spectrum near the baseline, where it appears that all of the spectral profile have baseline offset. Graph 1000 in FIG. 10 depicts the same spectrum as shown in graph 900, but represented in the 2D complex plane form. Specifically, FIGS. 9 and 10 are two different ways of visualizing the same spectra. From the spectrum viewed in FIG. 10, one can imagine the spectral circles that correspond to each of the ten different shapes in graph 1000. As described above, the equations for the sCircles are not difficult to compute.

Figure 11:
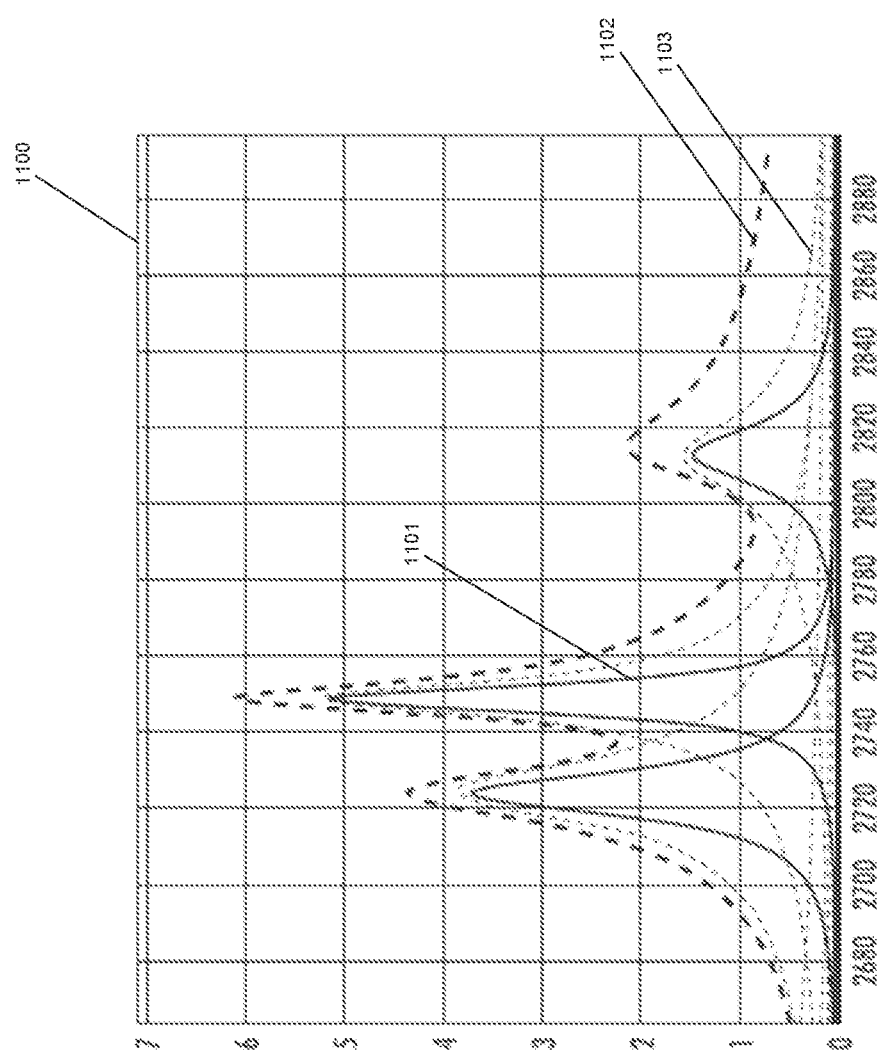
FIG. 11 is a graph depicting a spectra showing original unresolved, resolved, and dephased real part sProfiles according to an embodiment of the subject matter described herein.

As described above, if one computes the magnitude of each spectral circle, one can create a figure with resolved spectra. For example, graph 1100 in FIG. 11 shows a few of the isolated FID signal spectra. In FIG. 11, thick hash line 1102 is used to represent the total magnitude spectrum, the thin hash lines (e.g., thin hash line 1103) represent the magnitude spectrum of isolated profiles, and the solid lines 1104 and 1105 represent the isolated dephased real parts. Notably, the mdMRS methodology affords an accurate approximation for the taller sProfiles produced. More specifically, it has been determined that the resulting approximations are quite excellent for the taller sProfiles, generally within 2% accurate. Moreover, the shorter sProfiles, which suffer from buoyant effects from the taller sProfiles, have amplitude approximations that are good but less accurate.

Figure 12:
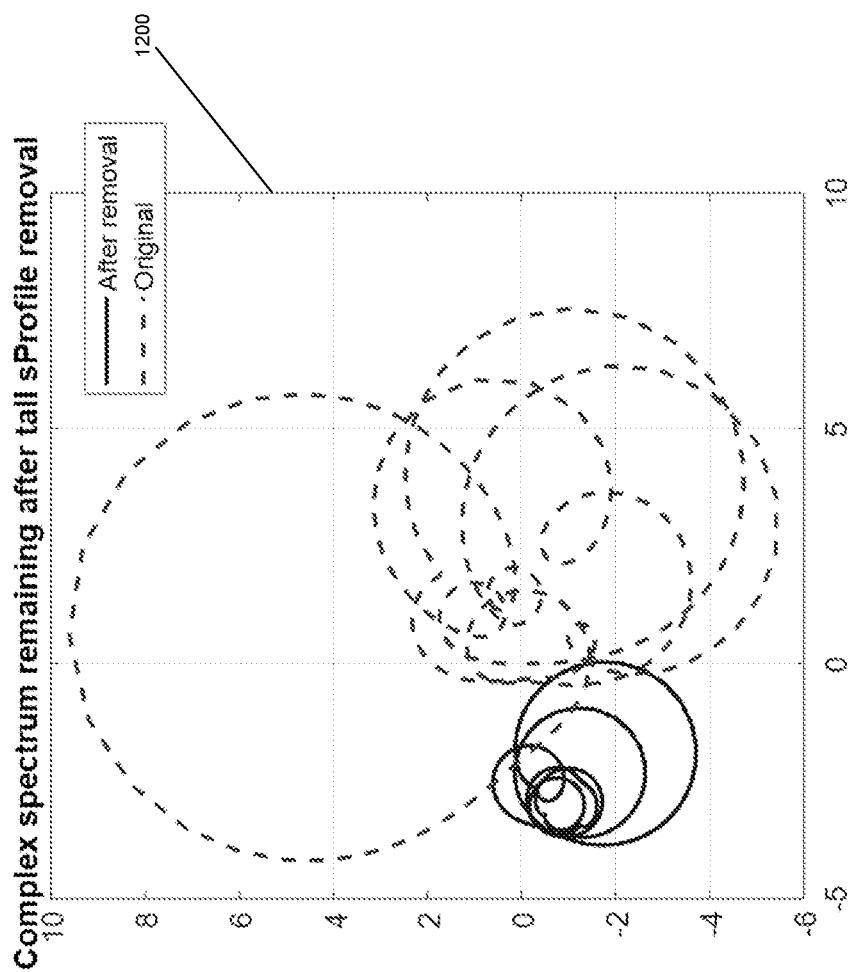
FIG. 12 is a graph depicting the complex spectrum remaining after a number of tall sProfiles are removed according to an embodiment of the subject matter described herein.
Figure 13:
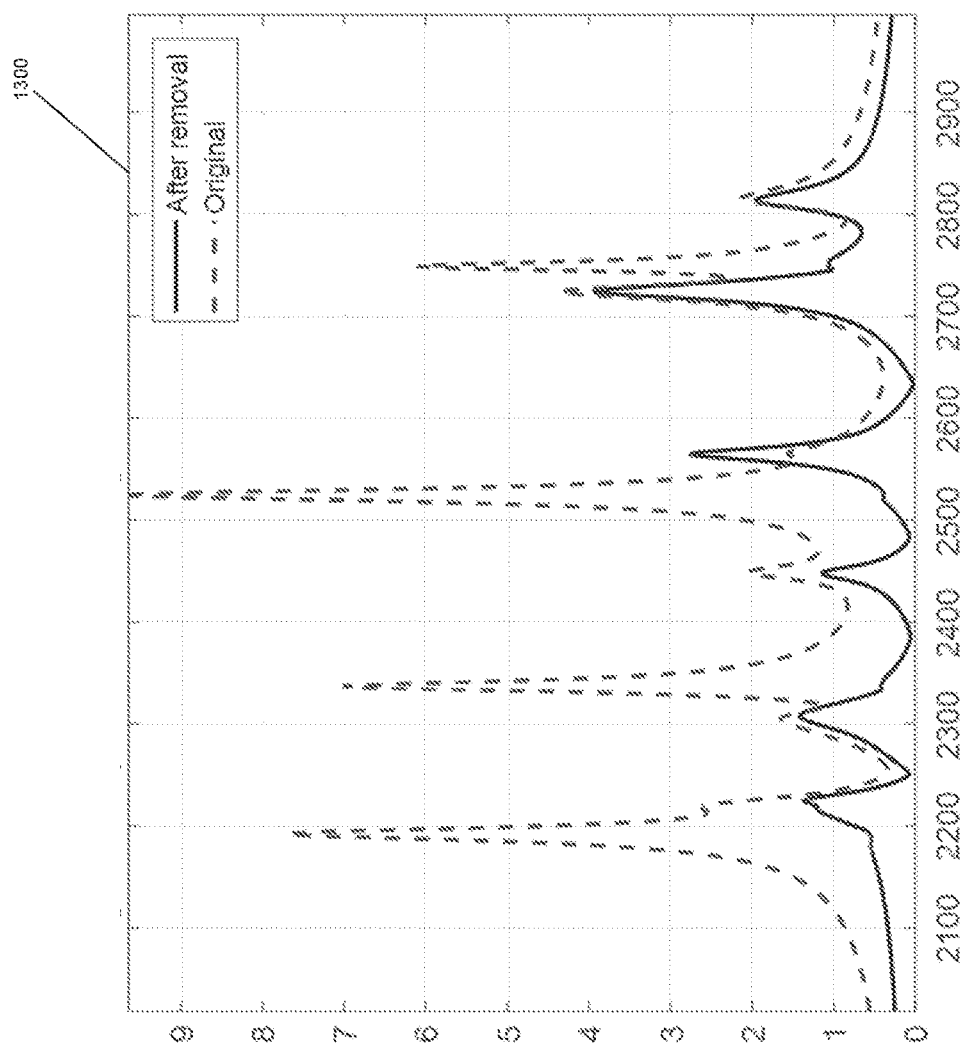
FIG. 13 is a graph depicting the magnitude spectrum remaining after a number of tall sProfiles are removed according to an embodiment of the subject matter described herein.

In some embodiments, to sharpen the amplitude estimates of the shorter sProfiles, the highly accurate sCircles of the taller sProfiles are subtracted, being careful to perform that subtraction in the complex plane/spectrum. For example, FIGS. 12 and 13 respectively show the complex spectrum and magnitude spectrum remaining after the five tallest sProfiles have been subtracted. More specifically, the dashed circles in graph 1200 are removed, thereby leaving the solid circles in the complex spectrum. Accordingly, the corresponding dashed peaks in graph 1300 are removed, thereby leaving the solid peaks in the magnitude spectrum.

In some embodiments, repeating the MRS analysis method on the remaining peaks does increase the accuracy of the amplitude estimates for the shorter sProfiles. Namely, the accuracy is within a relative error of 2.3% for all but one of the sProfiles, as listed in Table 1 below.

TABLE 1

Amplitude estimates and relative errors for sProfiles

Figure 14:
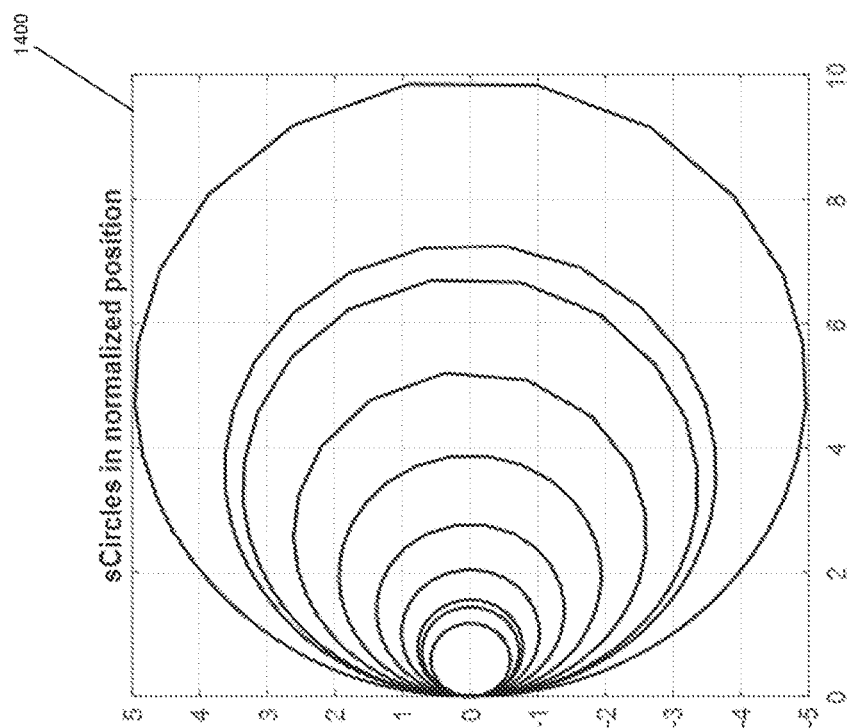
FIG. 14 is a graph depicting a plurality of normalized sCircles according to an embodiment of the subject matter described herein.

| Profile # | Amplitude Estimate | Relative Error |
|---|---|---|
| 1 | 68.59 | 0.023 |
| 2 | 21.67 | 0.015 |
| 3 | 28.96 | 0.066 |
| 4 | 52.89 | 0.021 |
| 5 | 12.79 | 0.016 |
| 6 | 80.84 | 0.010 |
| 7 | 26.61 | 0.014 |
| 8 | 26.88 | 0.005 |
| 9 | 34.57 | 0.017 |
| 10 | 23.13 | 0.006 | pAs described above, the mdMRS method translates and rotates each of the sCircles in the complex spectrum. As a matter of understanding the analysis method, the result is given in graph 1400 of FIG. 14, which shows the normalized position for all ten sCircles in this example.

Figure 15:
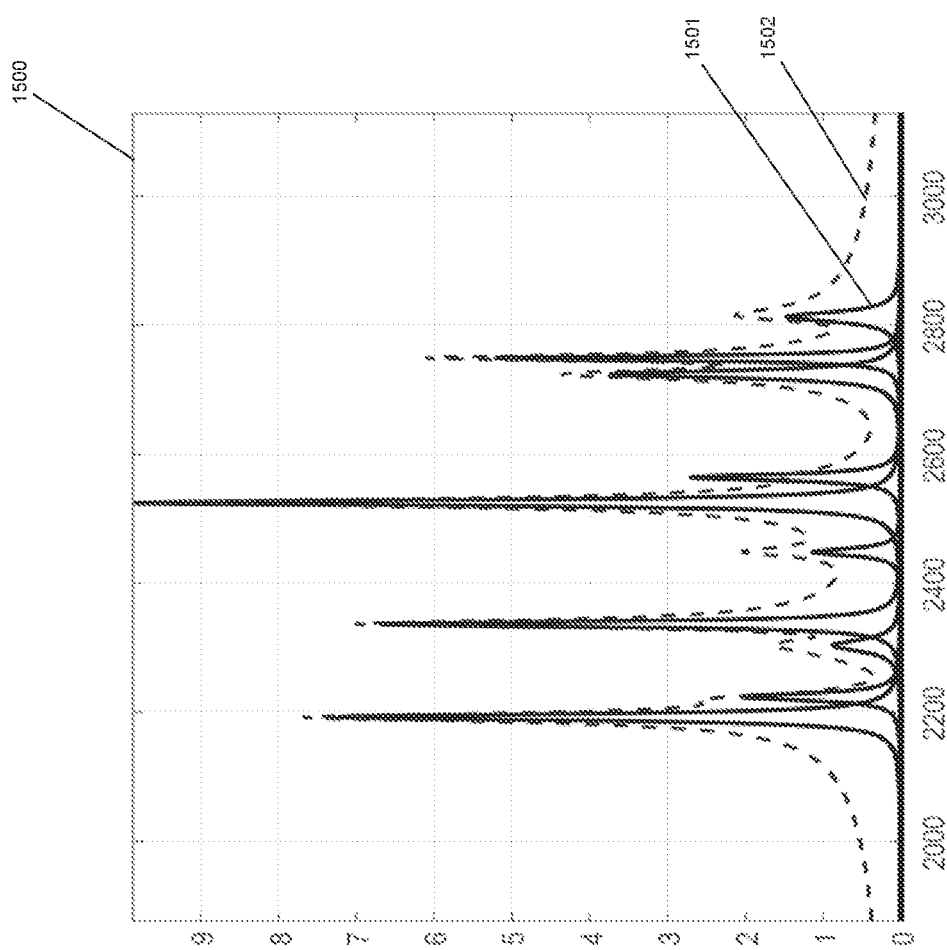
FIG. 15 is a graph depicting the isolated dephased real parts for each of a plurality of profiles overlaid with the original unresolved spectrum according to an embodiment of the subject matter described herein.

FIG. 15 includes a graph 1500 that depicts isolated dephased real parts (e.g., solid line 1501) of the sProfiles. Notably, the final step is to take the dephased real part profiles and determine the amplitudes, which provide the same ratios as the areas under each respective profile. Graph 1500 shows solid curves (e.g., solid line 1501) representing the isolated (i.e. resolved) dephased real part profiles for all ten terms in the FID. Moreover, the dash lines (e.g., dashed line 1502) in graph 1500 represent the original unresolved magnitude spectrum. Notably, graph 1500 illustrated the isolated real parts of the magnitude profile depicted in graph 900 in FIG. 9.

The computation of the concentration of a molecule or metabolite does not end after determining the spectral area under each dephased real part of a chosen molecule metabolite. Namely, the mdMRS process can be configured to utilize one or more equations to determine the concentration [M] from the mdMRS data. In some embodiments, an equation that requires the knowledge of the number of protons that affects a particular part of the metabolite spectrum can be used. In such scenarios, the proton number information can be obtained from one or more known databases (e.g., Human Metabolome Database). An exemplary database table is depicted in FIG. 16. For example, table 1600 includes a number of columns containing example metabolites that are commonly found in the human brain, the metabolite location, and the respective metabolite "Hs" values. Notably, these Hs (which represents a database acronym for how many protons affect the particular spectral profile of the metabolite) values can be used as a variable input into the formula below. For example, the variable $N_M$ used below indicates the number of protons affecting the metabolite's spectral profile).

Using water ($H_2O$) as a reference example since data from the MRI scanner device includes "no water suppressed" FID information for the same voxel as the FID signal used for analysis. The "intensity(M)" for metabolite M in the formula:

$$\frac{\text{Intensity}(M)}{[M]N_M} e^{-TE/T_2^*(M)} = \frac{\text{Intensity}(R)}{[R]N_R} e^{-TE/T_2^*(R)}$$

is the area under the dephased real part. Also, TE=30 milliseconds, [M] stands for the desired concentration, and $N_x$ for the number of protons affecting the particular spectral profile. The "R" terms in the generic formula for computing metabolite concentrations stand for a reference metabolite, which is often used as water. In this example, "Intensity ($H_2O$)" was computed using a reproducible formula for the area under the huge water profile of available "no water suppressed" data for the voxel of interest that uses a relation between the FWHM of the water spectral profile and the area of its dephased real part.

For the metabolites selected here, the computed concentrations are [NAA]=4.65 mM and [mI]=5.00 mM, values that are with 5% of the corresponding values found by LC Model software. The Choline spectral profile was sufficiently separated by mdMRS, which computed values that amounted to [PCh]=6.64 mM and [GPC]=1.22 mM. However, LCModel did not find values it deemed accurate for those metabolites, perhaps because the LCModel analysis could not separate the closely spaced PCh and GPC metabolites. Notably, the mdMRS method of subtracting the spectral profile of the residual water term in the complex plane eliminates that term's effect on the baseline.

Figure 17:
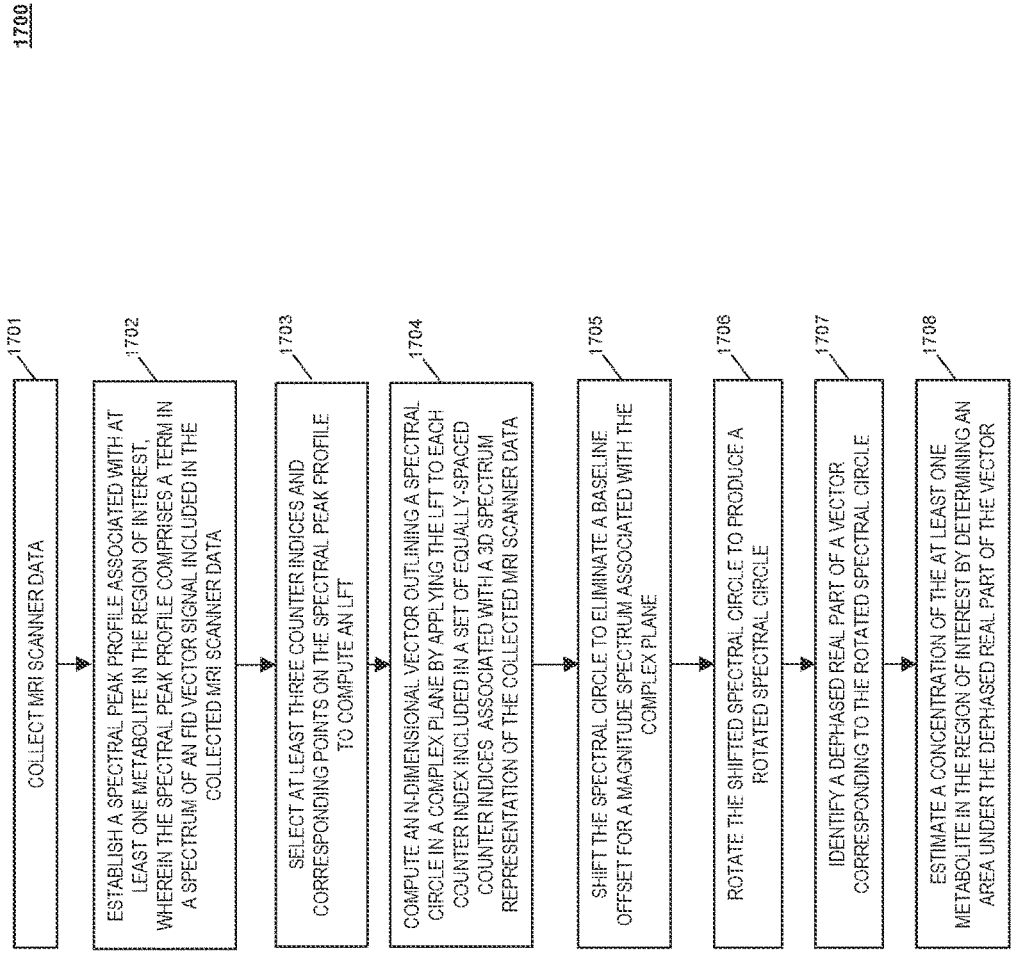
FIG. 17 illustrates an exemplary method for utilizing spectral circles for magnetic resonance spectroscopy analysis according to an embodiment of the subject matter described herein.

FIG. 17 is a flow chart illustrating an exemplary method 1700 for utilizing spectral circles for magnetic resonance spectroscopy analysis. In some embodiments, method 1700 includes an algorithm and/or software process that is stored in memory of computing device and subsequently executed by one or more hardware processors of the computing device. In some embodiments, method 1700 can be executed by an "mdMRS engine" and/or "metabolite concentration assessment engine" that is executed by one or more hardware processors of a stand-alone metabolite concentration assessment device that is communicatively connected to each of an MRI scanner and a display unit.

In block 1701, MRI scanner data corresponding to a region of interest (ROI) is collected. For example, the data can be collected from a typical hospital MRI scanner device on a living subject for an MR spectroscopy application. In some embodiments, the collected MRI scanner data is denoised resulting in a complex valued vector of size 1024×1, or 2048×1.

In block 1702, a spectral peak profile associated with at least one metabolite in the region of interest is established, wherein the spectral peak profile comprises a plurality of FID vector signals included in the collected MRI scanner data. In some embodiments, a three-dimensional spectral peak profile can be established from the collected MRI scanner data. Each of the FID signals of the spectral peak profile is a discrete function of time.

In some embodiments, it should be noted and/or assumed that a user may pre-specify one or more metabolites of interest. In the disclosed subject matter, the metabolites are considered 'one by one'. In contrast, prior art from previous MR spectroscopy analysis methods must use a rather large set of metabolites independent of user choice because of their use of least square minimization of the sum of the magnitude spectra of every metabolite in that large set to the one-dimensional magnitude spectrum of the FID. In some embodiments, the term 'metabolites' can be replaced by a more general term (such as 'molecules') for applications that extend beyond the determining of concentrations of brain metabolites.

In block 1703, at least three counter indices (e.g., peak frequency indices or counter values) and corresponding points on the spectral peak profile are selected to compute an LFT function. In some embodiments, the algorithm selects three or more counter indices that map to the spectral peak profile (pProfile). These counter indices can be designated as ($k_1, k_2, k_3$). For noise suppression, it is ideal to select indices that are close to the peak index, but any three indices that map to the pProfile will suffice. Notably, these counter indices respectively correspond to three complex DFT values on the magnitude spectrum. As such, the three points in the plane are denoted as ($k_i$, DFT($k_i$)), for $1 \leq i \leq 3$. These three points can be used to compute the three unknowns, e.g., (a,b,d), to completely establish/determine the LFT that maps the three counter indices to the corresponding points in the complex plane. In some embodiments, additional (e.g., more than 3 in total) counter indices can be selected if a denoising algorithm is to be utilized.

In block 1704, an N-dimensional vector outlining a spectral circle in a complex plane is computed by applying the LFT to each counter index included in the set of equally-spaced counter indices (e.g., peak frequency indices or index values), e.g., usually 1, 2, ..., 1024 values shown on the vertical axis of plot 400 in FIG. 4. More specifically, the spectral circle in a complex plane is computed by applying the LFT to each counter index included in a set of equally-spaced counter indices and/or values associated with a 3D spectrum representation of the collected MRI scanner data. That is, in some embodiments, the established/determined LFT is then applied to all of the frequency indices $1 \leq k \leq N$. The result is a vector representing the spectral Circle (sCircle) for that spectral peak profile (e.g., a vector of samples which outline the associated sCircle in the complex plane).

In block 1705, the spectral circle is shifted to eliminate a baseline offset for a magnitude spectrum associated with the complex plane. In some embodiments, shifting the spectral circle is performed via complex subtraction of a special constant related to the LFT from block 1704, such that the spectral circle traverses through the origin in the complex plane. That is, compute w=z−A, for all z values on the spectral circle and for a constant A. This shifting eliminates the "baseline offset" familiar as a problem to MRS analysis. Moreover, in some embodiments, the shifting of the spectral circle may constitute an optional step.

In block 1706, the shifted spectral circle is rotated to produce a 'rotated spectral circle', wherein a diameter of the rotated spectral circle is symmetric about the real axis in the complex plane and is positioned on the positive portion of the real axis. In some embodiments, this step includes rotating the (discrete) spectral circle by a particular angle $\phi$ such that i) the spectral circle is symmetric about the real axis, ii) the spectral circle passes through the origin, and iii) the diameter of spectral circle is positioned on the positive real axis. The rotation can be performed by complex multiplication, $w=e^{i\phi}z$.

In block 1707, a dephased real part of a vector corresponding to the rotated spectral circle is identified. Notably, the real part of the resulting vector that results from the rotation of the spectral circle in block 1706 is identified as the 'dephased real part'.

In block 1708, a concentration of the at least one metabolite in the region of interest is estimated by determining an area under the dephased real part of the vector. In some embodiments, the area under that vector/curve can be determined by numerical integration (e.g., using the trapezoidal rule). After determining the area under the vector/curve, the calculated value may be entered as value [M] into the aforementioned metabolite intensity formula (e.g., see formula relating concentration to area presented on page 22 above) in order to compute the metabolite concentration.

It will be understood that various details of the presently disclosed subject matter may be changed without departing from the scope of the presently disclosed subject matter. Furthermore, the foregoing description is for the purpose of illustration only, and not for the purpose of limitation.

What is claimed is:

1. A method comprising:
   collecting magnetic resonance imaging (MRI) scanner data corresponding to a region of interest;
   establishing a spectral peak profile associated with at least one metabolite in the region of interest, wherein the spectral peak profile comprises a term in a spectrum of an FID vector signal included in the collected MRI scanner data;
   selecting at least three counter indices and corresponding points on the spectral peak profile to compute a linear fractional transformation (LFT);
   computing a N-dimensional vector outlining a spectral circle in a complex plane by applying the LFT to each counter index included in a set of equally-spaced counter indices associated with a three-dimensional spectrum representation of the collected MRI scanner data;

shifting the spectral circle to eliminate a baseline offset for a magnitude spectrum associated with the complex plane;

rotating the shifted spectral circle to produce a rotated spectral circle, wherein a diameter of the rotated spectral circle is symmetric about a real axis in the complex plane and positioned on a positive section of the real axis;

identifying a dephased real part of a vector corresponding to the rotated spectral circle; and estimating a concentration of the at least one metabolite in the region of interest by determining an area under the dephased real part of the vector.

2. The method of claim 1 wherein the spectral peak profile is three-dimensional.

3. The method of claim 1 wherein the at least three counter indices correspond to a respective at least three complex discrete Fourier transform (DFT) values on a complex spectrum.

4. The method of claim 1 wherein the at least three counter indices and corresponding points are utilized to compute at least three unknown values to establish the LFT.

5. The method of claim 1 wherein the shifted spectral circle is rotated by subjecting the shifted spectral circle to a complex multiplication operation.

6. The method of claim 1 further comprises applying a noise reduction algorithm to the spectral peak profile in the event more than three counter indices are selected.

7. The method of claim 1 wherein the FID vector signal is a complex valued vector.

8. A system comprising:
a scanning device configured for collecting magnetic resonance imaging (MRI) scanner device data corresponding to a region of interest; and
a metabolite concentration assessment engine configured for receiving the collected MRI scanner device data, establishing a spectral peak profile associated with at least one metabolite in the region of interest, wherein the spectral peak profile comprises a term in a spectrum of an FID vector signal included in the collected MRI scanner data, selecting at least three counter indices and corresponding points on the spectral peak profile to compute a linear fractional transformation (LFT), computing an N-dimensional vector outlining a spectral circle in a complex plane by applying the LFT to each counter values included in a set of equally-spaced counter values associated with a three-dimensional spectrum representation of the collected MRI scanner data, shifting the spectral circle to eliminate a baseline offset for a magnitude spectrum associated with the complex plane, rotating the shifted spectral circle to produce a rotated spectral circle, wherein a diameter of the rotated spectral circle is symmetric about a real axis in the complex plane and positioned on a positive section of the real axis, identifying a dephased real part of a vector corresponding to the rotated spectral circle, and estimating a concentration of the at least one metabolite in the region of interest by determining an area under the dephased real part of the vector.

9. The system of claim 8 wherein the spectral peak profile is three-dimensional.

10. The system of claim 8 wherein the at least three counter indices correspond to a respective at least three complex discrete Fourier transform (DFT) values on a complex spectrum.

11. The system of claim 8 wherein the at least three counter indices and corresponding points are utilized to compute at least three unknown values to establish the LFT.

12. The system of claim 8 wherein the shifted spectral circle is rotated by subjecting the shifted spectral circle to a complex multiplication operation.

13. The system of claim 8 further comprises applying a noise reduction algorithm to the spectral peak profile in the event more than three counter indices are selected.

14. The system of claim 8 wherein the FID vector signal is a complex valued vector.

15. A non-transitory computer readable medium having stored thereon executable instructions that when executed by a processor of a computer control the computer to perform steps comprising:
collecting magnetic resonance imaging (MRI) scanner data corresponding to a region of interest;
establishing a spectral peak profile associated with at least one metabolite in the region of interest, wherein the spectral peak profile comprises a term in a spectrum of an FID vector signal included in the collected MRI scanner data;
selecting at least three counter indices and corresponding points on the spectral peak profile to compute a linear fractional transformation (LFT);
computing an N-dimensional vector outlining a spectral circle in a complex plane by applying the LFT to each counter value included in a set of equally-spaced counter values associated with a three-dimensional spectrum representation of the collected MRI scanner data;
shifting the spectral circle to eliminate a baseline offset for a magnitude spectrum associated with the complex plane;
rotating the shifted spectral circle to produce a rotated spectral circle, wherein a diameter of the rotated spectral circle is symmetric about a real axis in the complex plane and positioned on a positive section of the real axis;
identifying a dephased real part of a vector corresponding to the rotated spectral circle; and estimating a concentration of the at least one metabolite in the region of interest by determining an area under the dephased real part of the vector.

16. The non-transitory computer readable medium of claim 15 wherein the spectral peak profile is three-dimensional.

17. The non-transitory computer readable medium of claim 15 wherein the at least counter indices correspond to a respective at least three complex discrete Fourier transform (DFT) values on a complex spectrum.

18. The non-transitory computer readable medium of claim 15 wherein the at least three counter indices and corresponding points are utilized to compute at least three unknown values to establish the LFT.

19. The non-transitory computer readable medium of claim 15 wherein the shifted spectral circle is rotated by subjecting the shifted spectral circle to a complex multiplication operation.

20. The non-transitory computer readable medium of claim 15 further comprises applying a noise reduction algorithm to the spectral peak profile in the event more than three counter indices are selected.

\* \* \* \* \*